United States Patent
Yee et al.

(10) Patent No.: US 8,126,443 B2
(45) Date of Patent: Feb. 28, 2012

(54) AUXILIARY OUTPUT DEVICE

(75) Inventors: Dawson Yee, Bellevue, WA (US); Anoop Gupta, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 483 days.

(21) Appl. No.: 11/451,641

(22) Filed: Jun. 13, 2006

(65) Prior Publication Data
US 2007/0285390 A1     Dec. 13, 2007

(51) Int. Cl.
*H04W 4/00* (2009.01)
(52) U.S. Cl. .............. 455/416; 455/414.1; 455/455; 370/352
(58) Field of Classification Search .............. 345/163; 455/414.1, 445, 416; 370/352
See application file for complete search history.

(56) References Cited

U.S. PATENT DOCUMENTS

| | | | |
|---|---|---|---|
| 5,757,898 | A | 5/1998 | Nishikawa |
| 6,094,681 | A | 7/2000 | Shaffer |
| 6,138,036 | A | 10/2000 | O'Cinneide |
| 6,298,449 | B1 | 10/2001 | Carter |
| 6,510,325 | B1 | 1/2003 | Mack, II |
| 6,615,201 | B1 | 9/2003 | Seshadri |
| 6,711,160 | B2 | 3/2004 | Chan |
| 6,847,334 | B2 | 1/2005 | Hayhurst |
| 2001/0046862 | A1* | 11/2001 | Coppinger et al. .......... 455/435 |
| 2003/0211888 | A1 | 11/2003 | Wolinsky |
| 2003/0236924 | A1 | 12/2003 | Auffret |
| 2004/0137967 | A1 | 7/2004 | Bodley |
| 2004/0225901 | A1* | 11/2004 | Bear et al. ................ 713/300 |
| 2006/0119537 | A1* | 6/2006 | Vong et al. ................ 345/1.3 |
| 2006/0130075 | A1* | 6/2006 | Rhoten et al. ............. 719/328 |

FOREIGN PATENT DOCUMENTS

| | | |
|---|---|---|
| KR | 20020018351 | 3/2002 |
| WO | 2005107260 A1 | 11/2005 |

OTHER PUBLICATIONS

Paul Pinella, Athens PC: Higher Value, Higher Margins, Jun. 2003, 5 pages.
VOIPsupply.Com, Cisco CP-7970G Color TouchScreen IP Phone, http://www.voipsupply.com/product_info.php? products_id=255, last viewed on Jan. 24, 2006, 3 pages.
Microsoft Corporation, Hardware Innovation for Windows—Windows Home Concept, 2004, 27 pages.
International Search Report dated Jul. 24, 2007, Application No. PCT/US2007/004450, (10 pages).
Russian Decision on Grant of a Patent for Invention, Application No. 200814997/8(064419), dated May 26, 2011, 5 pages.
Chinese Patent Application No. 200780022202.04, Office Action mailed Jun. 22, 2011, 16 pages.

* cited by examiner

*Primary Examiner* — Pierre-Louis Desir (57) ABSTRACT

Techniques are provided for notification regarding communications. An incoming communication for a user of a primary device is received. An auxiliary device is provided for the primary device. Filter criteria for the auxiliary device is provided. A determination is made as to whether information regarding the incoming communication is sent to the auxiliary device in accordance with the filter criteria.

16 Claims, 7 Drawing Sheets

AUXILIARY OUTPUT DEVICE

BACKGROUND

A user can only interact with his/her computer when the computer is on and when a screen saver has not otherwise locked the computer. While the computer is off or otherwise is locked via the screen saver, communications may still be directed to the computer. In order for a user to access an email or other such communications received by the computer for the duration when the computer is powered off or is otherwise locked by the screensaver, the user takes steps to enable interaction with the computer in order to determine if an important communication has been received. One drawback of the foregoing is that the steps the user takes are performed manually, for example, to log into the computer. Another drawback is that a user performs the foregoing steps to enable interaction with the computer in order to monitor and make a determination if an important communication has been received.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Techniques are provided for notification regarding communications. An incoming communication for a user of a primary device is received. An auxiliary device is provided for the primary device. Filter criteria for the auxiliary device is provided. It is determined whether information regarding the incoming communication is sent to the auxiliary device in accordance with the filter criteria. The auxiliary device may be used to provide notification for communications received at the primary device in accordance with the filter criteria.

DESCRIPTION OF THE DRAWINGS

Features and advantages of the present invention will become more apparent from the following detailed description of exemplary embodiments thereof taken in conjunction with the accompanying drawings in which.

DETAILED DESCRIPTION

Figure 1:
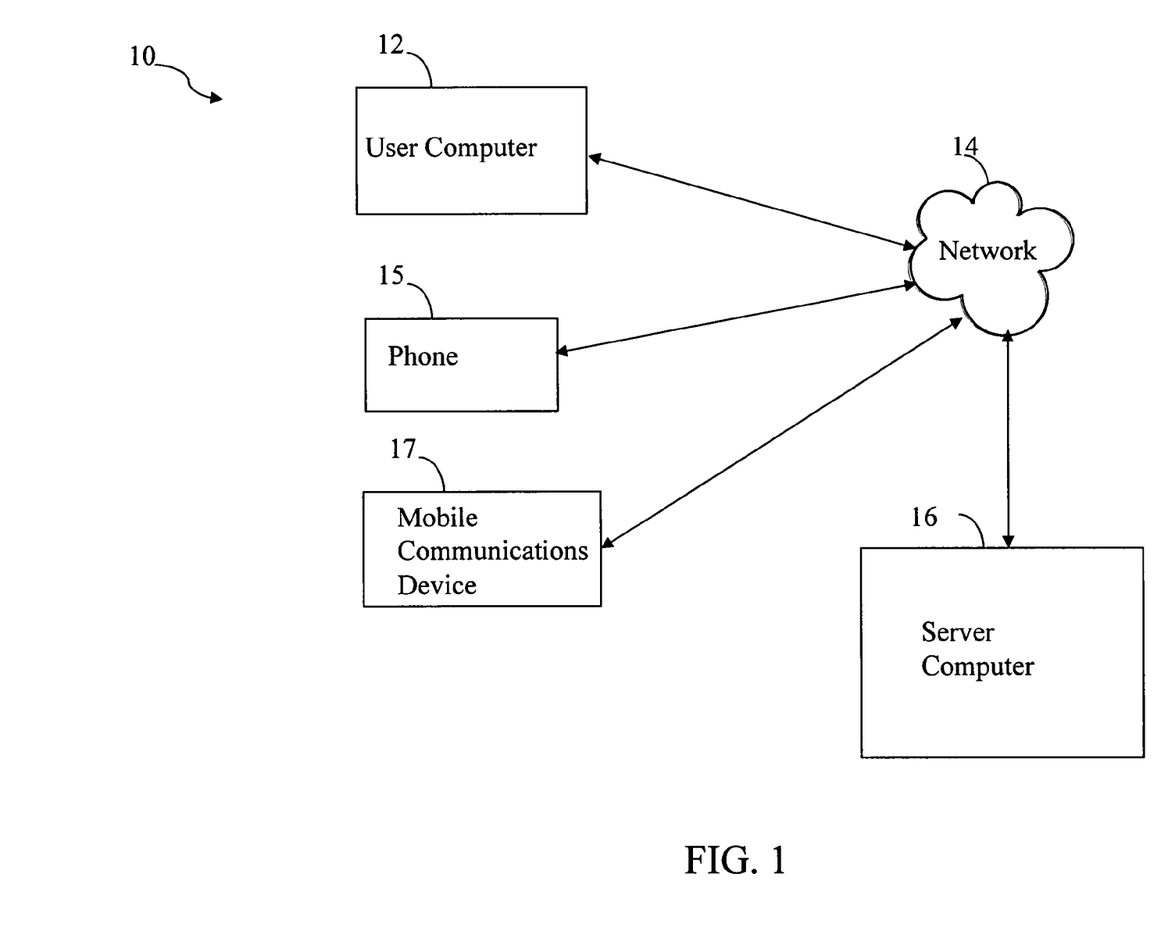
FIG. 1 is an example of an embodiment illustrating an environment that may be utilized in connection with the techniques described herein.

Referring now to FIG. 1, illustrated is an example of a suitable computing environment in which embodiments utilizing the techniques described herein may be implemented. The computing environment illustrated in FIG. 1 is only one example of a suitable computing environment and is not intended to suggest any limitation as to the scope of use or functionality of the techniques described herein in connection with an auxiliary output device. Those skilled in the art will appreciate that the techniques described herein may be suitable for use with other general purpose and specialized purpose computing environments and configurations. Examples of well known computing systems, environments, and/or configurations include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like.

The techniques set forth herein may be described in the general context of computer-executable instructions, such as program modules, executed by one or more computers or other devices. Generally, program modules include routines, programs, objects, components, data structures, and the like, that perform particular tasks or implement particular abstract data types. Typically the functionality of the program modules may be combined or distributed as desired in various embodiments.

Included in FIG. 1 are a user computer 12, a network 14, a phone 15, a mobile communications device 16, and a server computer 16. The mobile communications device 16 may be, for example, a wireless device such as a mobile phone or a PDA. The devices 12, 15 and 17 included in FIG. 1 are exemplary for purposes of illustrating the techniques described herein in connection with an auxiliary output device. Any device that has connectivity to the server 16 and having the functionality described herein may be included in an embodiment. Additionally, although a particular number of devices are illustrated, an embodiment may use one or more devices. The devices 12, 15, and 17 may include a processor used to execute code included in one or more program modules. Described in more detail elsewhere herein are program modules that may be executed by the devices in connection with the techniques described herein. The devices 12, 15 and 17 may operate in a networked environment and communicate with the server computer 16 and other computers not shown in FIG. 1.

In operation, an incoming transmission for a user may be received by the server computer 16. The incoming transmission is then forwarded to the appropriate one or more registered devices associated with a user identifier for the particular user. As will be described in more detail in following paragraphs, the incoming transmission may be directed to a first device. The incoming transmission may also be directed to a second auxiliary communications device in accordance with filtering criteria. For example, as will be described herein in more detail, a user's computer may be on with the screen saver also enabled and displayed due to inactivity on the user computer. When an incoming communication, such as an email or meeting notification/reminder is received at the computer, an audible tone may occur indicating that the computer has received the communication. The screen saver as well as a password prompt may be enabled as a security measure when the computer is inactive for a designated time period. In existing systems, the user takes steps to clear the screen saver, such as typing in a password to unlock the computer. The foregoing steps may be taken by the user to view the received communication and make a determination as to the importance of the event related to the communication.

Using techniques that are described herein, an auxiliary output device may be designated to receive a notification of an incoming communication designated for a primary device, such as the computer. In one embodiment described herein, the auxiliary device may receive the notification independent of the state of the computer. For example, the notification may be sent to the auxiliary device independent of whether the computer is powered on/off and also independent of whether the computer is in an inactive or locked stated, such as when the screen saver is displayed. In connection with the foregoing example, an incoming communication may be directed to the user computer with the screen saver and password prompt displayed. The computer may receive the communication. Additionally, the incoming communication, or notification regarding the incoming communication, may also be sent to the auxiliary output device. The user may view a display of the auxiliary output device, such as a phone display, to see the notification rather than logging on to the computer to view the incoming communication. In connection with the techniques described herein, the user may also specify filtering criteria for the auxiliary output device so that notifications sent to the auxiliary output device's display are selectively displayed. In other words, the user may specify filtering criteria designating which incoming communications to the primary device cause a notification to be displayed on the auxiliary output device.

It will be appreciated by those skilled in the art that although the devices 12, 15, and 17 are shown in the example as communicating in a networked environment, the devices 12, 15, and 17 may communicate with other components utilizing different communication mediums. For example, the user computer 12 may communicate with one or more components utilizing a network connection, and/or other type of link known in the art including, but not limited to, the Internet, an intranet, or other wireless and/or hardwired connection(s).

Figure 2:
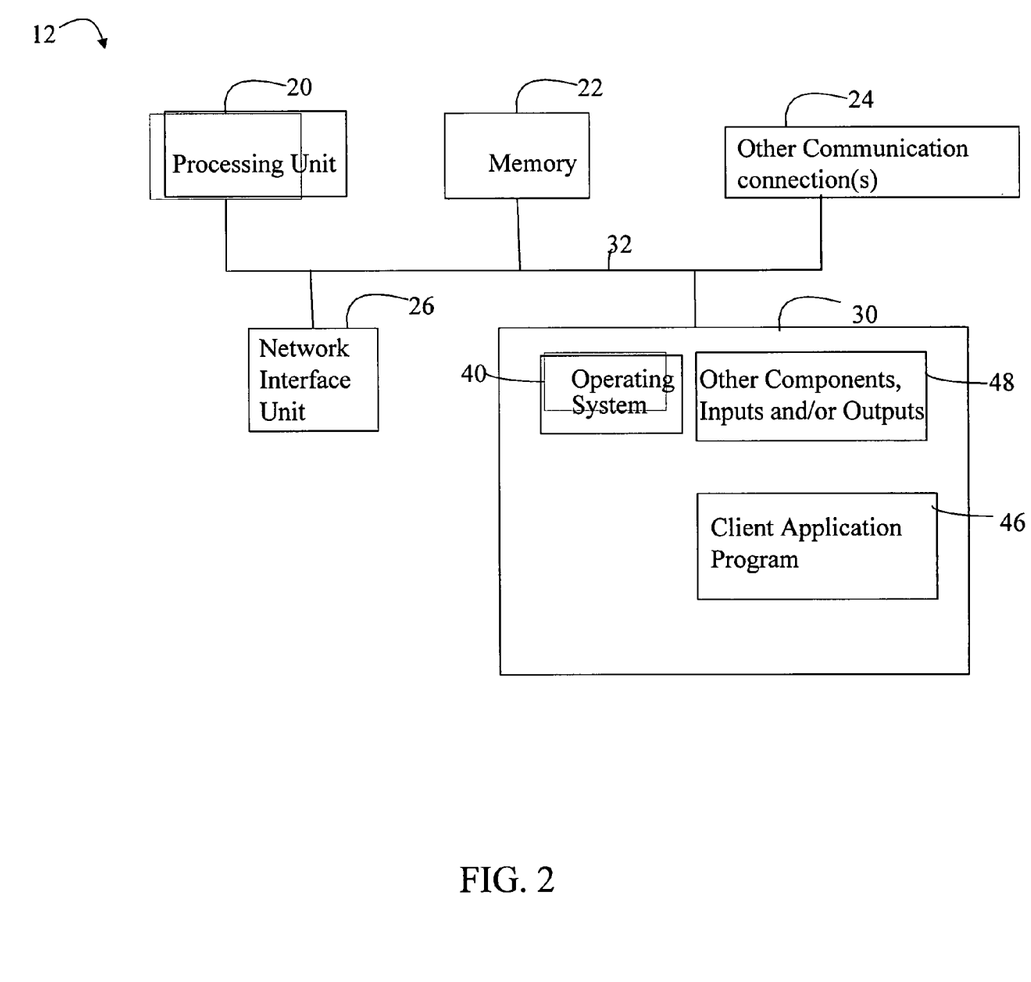
FIG. 2 is an example of components that may be included in an embodiment of a user computer for use in connection with performing the techniques described herein.

Referring now to FIG. 2, shown is an example of components that may be included in one of the devices, the user computer 12, as may be used in connection with performing the various embodiments of the techniques described herein. The user computer 12 may include one or more processing units 20, memory 22, a network interface unit 26, storage 30, one or more other communication connections 24, and a system bus 32 used to facilitate communications between the components of the computer 12.

Depending on the configuration and type of user computer 12, memory 22 may be volatile (such as RAM), non-volatile (such as ROM, flash memory, etc.) or some combination of the two. Additionally, the user computer 12 may also have additional features/functionality. For example, the user computer 12 may also include additional storage (removable and/or non-removable) including, but not limited to, USB devices, magnetic or optical disks, or tape. Such additional storage is illustrated in FIG. 2 by storage 30. The storage 30 of FIG. 2 may include one or more removable and non-removable storage devices having associated computer-readable media that may be utilized by the user computer 12. The storage 30 in one embodiment may be a mass-storage device with associated computer-readable media providing non-volatile storage for the user computer 12. Although the description of computer-readable media as illustrated in this example may refer to a mass storage device, such as a hard disk or CD-ROM drive, it will be appreciated by those skilled in the art that the computer-readable media can be any available media that can be accessed by the user computer 12.

By way of example, and not limitation, computer readable media may comprise computer storage media and communication media. Memory 22, as well as storage 30, are examples of computer storage media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can accessed by user computer 12. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The user computer 12 may also contain communications connection(s) 24 that allow the user computer to communicate with other devices and components such as, by way of example, input devices and output devices. Input devices may include, for example, a keyboard, mouse, pen, voice input device, touch input device, etc. Output device(s) may include, for example, a display, speakers, printer, and the like. These and other devices are well known in the art and need not be discussed at length here. The one or more communications connection(s) 24 are an example of communication media.

In one embodiment, the user computer 12 may operate in a networked environment as illustrated in FIG. 1 using logical connections to remote computers through a network. The user computer 12 may connect to the network 14 of FIG. 1 through a network interface unit 26 connected to bus 32. The network interface unit 26 may also be utilized in connection with other types of networks and/or remote systems and components.

One or more program modules and/or data files may be included in storage 30. During operation of the user computer 12, one or more of these elements included in the storage 30 may also reside in a portion of memory 22, such as, for example, RAM for controlling the operation of the user computer 12. The example of FIG. 2 illustrates various components including an operating system 40, one or more application programs 46, and other components, inputs, and/or outputs 48.

The operating system 40 may be any one of a variety of commercially available or proprietary operating systems. The operating system 40, for example, may be loaded into memory in connection with controlling operation of the user computer. One or more application programs 46 may execute in the user computer 12 in connection with performing user tasks and operations.

The application program 46 may be, for example, code which monitors the activity on the computer 12 causing display of a screensaver when there is inactivity. For example, the screensaver may be displayed after a period of inactivity on the user computer. The screensaver may also require the user to enter a password in order to resume interaction as a security measure.

In one embodiment, the device 12 may include an application program 46 that is a client-side calendar and scheduling program reporting scheduling information to a central location, such as to a server-side calendar and scheduling application on server 16. The client and server-side calendar and scheduling applications may be utilized to schedule meetings, keep a calendar of activities, appointments, and the like. Each user have such a client application as the client-side calendar and scheduling program may be registered at a central location, such as the server 16.

Although details of one particular device, the user computer 12, have just been described, it will be appreciated by those skilled in the art that other devices, such as 15 and 17, may include components similar to those described in connection with the user computer 12 to perform the techniques described herein.

In connection with the techniques described herein, the device including a client application, such as the foregoing client-side calendar and scheduling program, may be specified as an auxiliary output device. In such instances, the client application may also perform operations to selectively retrieve and display notifications of incoming transmissions for a primary device in accordance with filtering criteria. In one embodiment, a user may utilize a webpage interface to specify filtering criteria. The filtering criteria may be used to selectively identify particular events, such as particular incoming emails, meeting notifications, and other incoming electronic transmissions of a primary device. In an embodiment in which the filtering criteria is input at a location other than the auxiliary device, the filtering criteria may be communicated to the appropriate auxiliary device. An embodiment may also provide for specifying the filtering criteria directly or locally at an auxiliary device in accordance with the particular user interface available on the auxiliary device. When specifying the filtering criteria, the primary device to be queried in accordance with the filtering criteria may also be designated such as by specifying a network address of the primary device in the network.

Incoming communications in a network, such as illustrated in FIG. 1, may be received at a central location, such as the server 16. As will be described in following paragraphs, the server 16 may include components for facilitating communications with devices and appropriately routing or forwarding incoming communications to the various devices. For example, an incoming email for a user may be received by the server 16 which then forwards the incoming email to the appropriate user's computer with an email client application. In this example, the user's computer may function as a primary device. The user may designate another device, such as a phone or mobile communications device, as an auxiliary output device by specifying filtering criteria as described above. Subsequently, the auxiliary device may query the server at predetermined intervals to selectively retrieve information, in accordance with the filtering criteria, regarding communications received and sent to the user's computer. In this example, the communications are emails and an email client application on the auxiliary device may obtain such information by communicating with a corresponding email server application on the server. In response to the query, the server may return the information and the email client application may perform processing to display notifications regarding the received communications on a display of the auxiliary device.

The particular filtering criteria may vary with the type of incoming transmission. In one embodiment, the client application on an auxiliary device may maintain and access filtering criteria for transmissions received at a primary device. The filtering criteria may be specified for each client application in accordance with the particular electronic transmissions for each client application. For example, a client application may be an email client application. An instance of the email client application may be on the primary device and another instance of the email client application may be on the auxiliary device. Filtering criteria specified and used by the client application on the auxiliary device to retrieve information regarding emails sent to the primary device may indicate filtering criteria for email transmissions. The filtering criteria may include, for example, a priority associated with a message as may be assigned by the sender (e.g. higher priority may indicate an urgent email), another registered user, an email address of a sender or one or more other recipients, a defined group of users or email addresses, a domain name, and the like. The email client application on the auxiliary device may perform processing to retrieve information regarding received email communications forwarded to a primary device, such as the user computer. The email client application on the auxiliary device may query a corresponding email server application on the server 16 to retrieve the information in accordance with the specified filtering criteria.

As another example, a client application may be a client-side calendar and scheduling program. A first instance of the client application may be executing on the primary device and another instance of the client application may be executing on the auxiliary device. The foregoing client application on the primary device may receive communications from a server application regarding newly scheduled meetings, appointment reminders as the time of a scheduled meeting draws near, and the like. The client application on the auxiliary device may query the server regarding communications forwarded by the server to the primary device in accordance with filtering criteria specified for the auxiliary device. Filtering criteria may be specified so that the auxiliary device may retrieve selectively retrieve information regarding reminder or notification messages for meetings on certain days, times, and the like, meetings originated by named users, and the like. The client application on the auxiliary device may perform processing to retrieve information from the server regarding meeting communications forwarded to a primary device, such as the user computer. The client calendar and scheduling application may query a corresponding server application on the server 16 to retrieve the information in accordance with the specified filtering criteria.

In an embodiment in which the client application performs functionality associated with more than one service, such as a client application that performs both email and calendar and scheduling services, the client application on the auxiliary device may perform operations in connection with the techniques described herein for all the services provided by the client application.

In one embodiment, the filtering criteria may be specified for each auxiliary device. For example, a user computer functioning as a primary device may receive both personal and business emails. A first set of filtering criteria may be specified for a first auxiliary device for the primary device. The first auxiliary device may be used to display notifications regarding communications of a personal or non-business nature. A second different set of criteria may be specified for a second auxiliary device of the primary device. The second auxiliary device may be used to display notifications regarding communications of a business nature.

In one embodiment, the filtering criteria may be specified per client application on each auxiliary device where each client application performs processing for maintaining the filtering criteria, retrieving information regarding communications forwarded to a primary device having another instance of the client application, and causing notifications to be appropriately displayed on a display of the auxiliary output device for the filtered communications.

Figure 3:
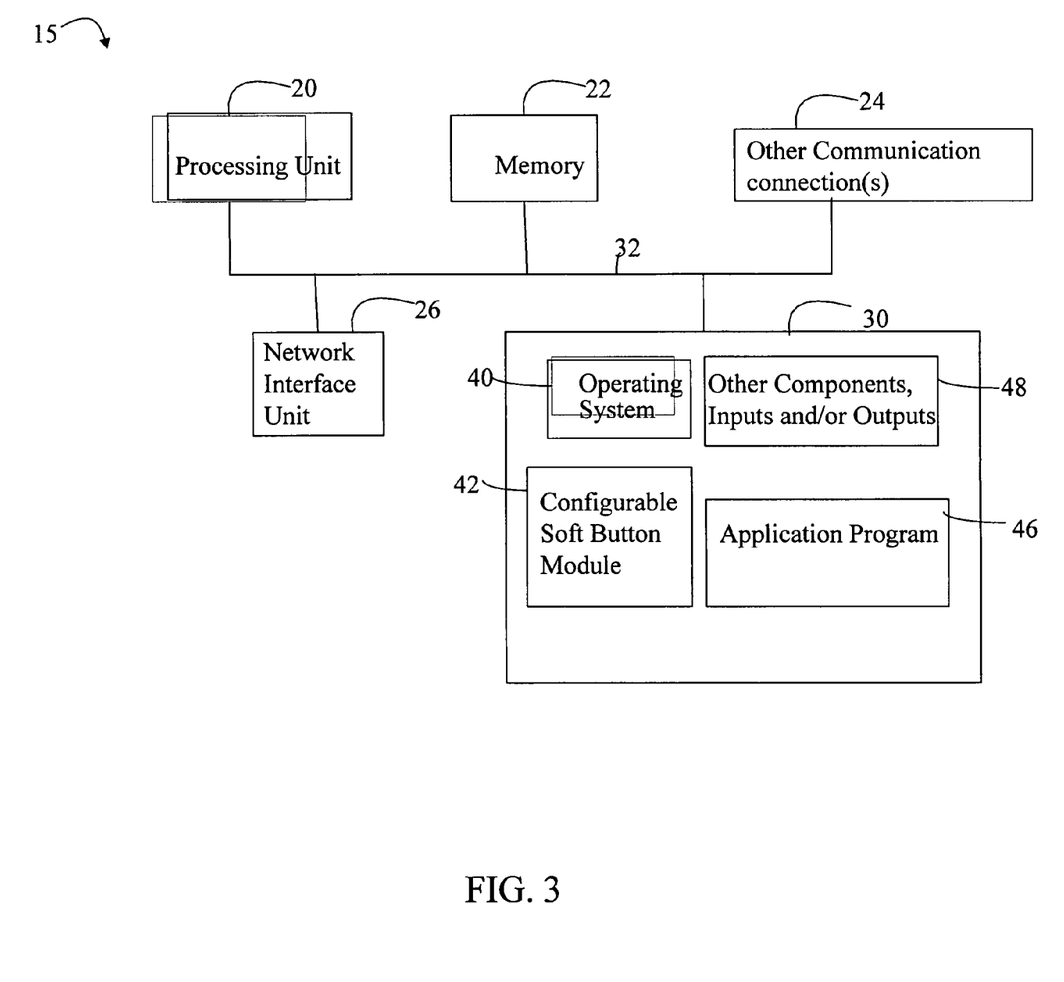
FIG. 3 is an example of components that may be included in an embodiment of a phone device for use in connection with performing the techniques described herein.

Referring now to FIG. 3, shown is an example of components that may be included in a phone device 15 and used in connection with performing the various embodiments of the techniques described herein. As illustrated in FIG. 3, an embodiment of the phone device 15 may include components similar to those described in connection with FIG. 2. Additionally, the phone 15 may include a configurable soft button module 42.

In one embodiment, the computer 12 may function as a primary device receiving incoming communications. In this embodiment, the phone 15 may function as an auxiliary output device for the primary device in connection with the techniques described herein. The phone 15 may include one or more application programs 46, an operating system and other components as illustrated and described in connection with FIG. 2. The application programs on the phone 15 may perform processing as described herein when operating on the phone 15 functioning as an auxiliary output device.

The phone 15, or other device functioning as an auxiliary output device, may include a configurable soft button module 42. The configurable soft button module 42 may be used in connection with programming or configuring soft buttons of the phone 15 in response to a currently selected or displayed notification on the phone 15. As described above, one or more notifications may be displayed on a display area of the phone 15 functioning as an auxiliary output device. The one or more notifications may be displayed, for example, by a client application on the phone 15 in response to selectively querying the server for incoming transmissions for the computer 12 functioning as a primary device. The module 42 may configure one or more soft buttons in response to a currently selected or displayed notification in a display area of the phone 15. The module 42 may also facilitate processing associated with a selection of one of the buttons, and may communicate information regarding the selection to one or more other components. For example, in response to selecting a first soft button or key having an associated operation, the module 42 may communicate with a calendar and scheduling client application 46 on the auxiliary device to perform one or more processing steps to complete the operation associated with the soft button selected.

In response to a currently selected or displayed notification, the phone 15 may have one or more soft buttons configured as active by module 42. Each soft button may correspond to a different operation which may be taken by a user in response to the notification. Selection of a soft button may result in execution of processing steps to perform the corresponding operation. The particular configuration of one or more of the soft buttons may change with time as well as the currently selected or displayed notification of the auxiliary device. The soft buttons may be programmed to a first configuration, for example, when a notification concerns an email. The soft buttons may be programmed to a different configuration, for example, when a notification regarding a scheduled meeting is displayed. Examples of such operations and processing performed are described elsewhere herein. The operations associated with the soft buttons may be performed with respect to a current notification context. The current notification context may be the notification which is currently selected or displayed on the phone 15.

It should be noted that the mobile communications device 17 may also be function as an auxiliary or primary device in connection with the techniques described herein and may include components similar to the phone as illustrated and described.

Figure 4:
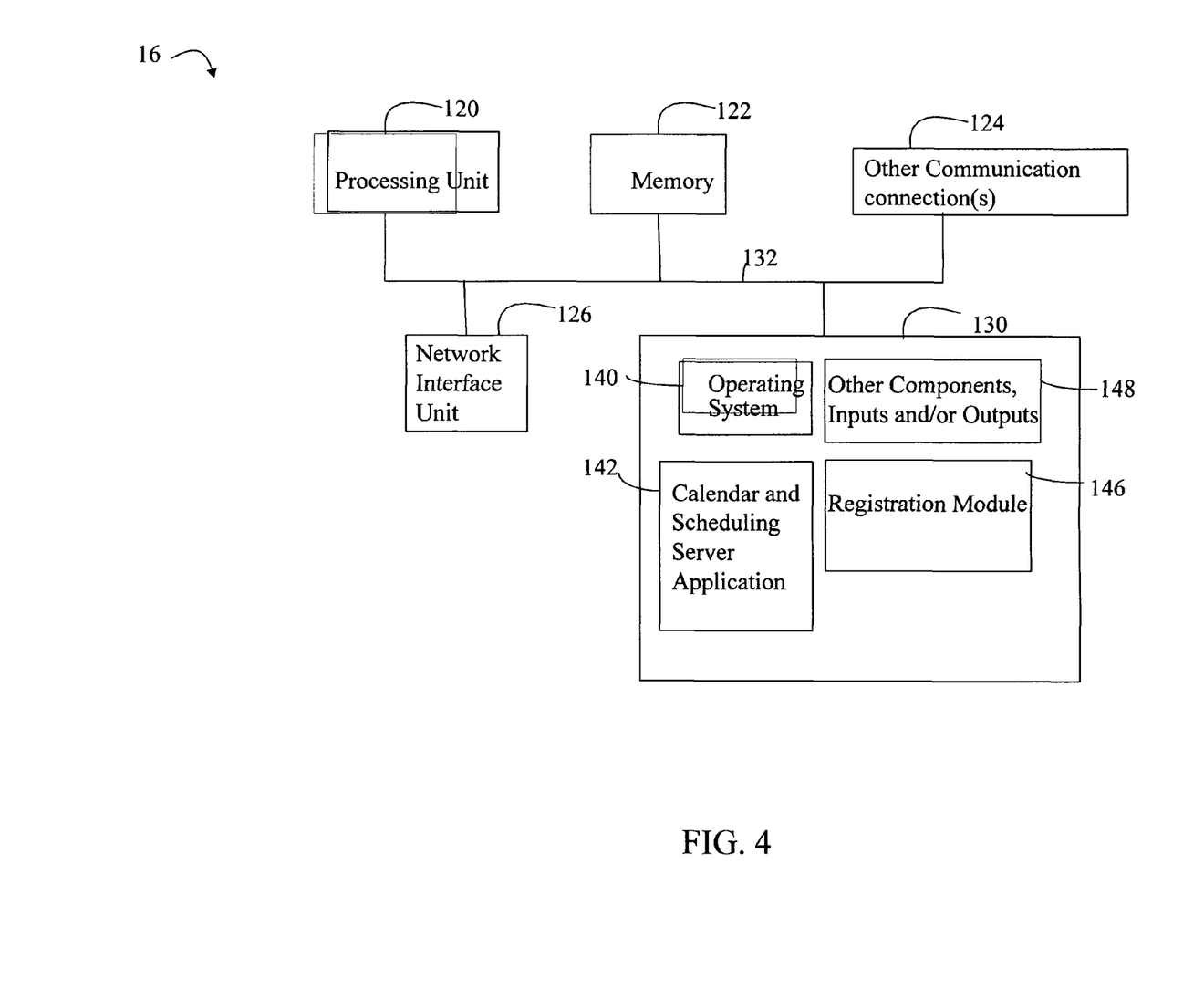
FIG. 4 is an example of components that may be included in an embodiment of a server computer for use in connection with performing the techniques described herein.

Referring now to FIG. 4, shown is an example of components that may be included in the server computer and used in connection with performing the various embodiments of the techniques described herein. As illustrated in FIG. 4, an embodiment of the server computer 16 may include components similar to those described in connection with FIGS. 2 and 3. Additionally, the server computer 16 may include a calendar and scheduling server application 142, and a registration module 146. In one embodiment, the server computer 16 may be a communication server which communicates with one or more devices for registered users.

The registration module 146 may be used in connection with registration of a user. As part of the registration process, the user may be assigned a user identifier and register one or more associated devices for the particular user identifier. The user may also be assigned a password or other information used in connection with device authentication. Each of the registered devices for a user may be assigned an address within the network such as illustrated in connection with FIG. 1. The server 16 may use such address information for each device in connection with forwarding communications to the devices for each user.

The calendar and scheduling server application 142 is a server-side application which, as also described elsewhere herein, collects and maintains calendar and appointment information for one or more users. Schedule and appointment information may be communicated from a corresponding client-side portion of the application residing on one or more user devices. As an example, a user may schedule a meeting between himself/herself and one or more other users. The user may use a client application on a device to input information regarding the meeting request. The input information may be communicated by the device to the server application 142. The server application 142 may then forward the request to the one or more other users and accordingly update each of the users' calendar and appointment information as maintained on the server when each user indicates acceptance of the meeting request. The server application 142 may, for example, send one or more meeting reminder notifications to each of the user participants as the meeting time draws near on the scheduled date.

It should be noted that although the functions performed herein in connection with the server computer are illustrated with a single computer, an embodiment may include one or more server computers in connection with performing the functions described herein by the server computer 16.

Figure 5:
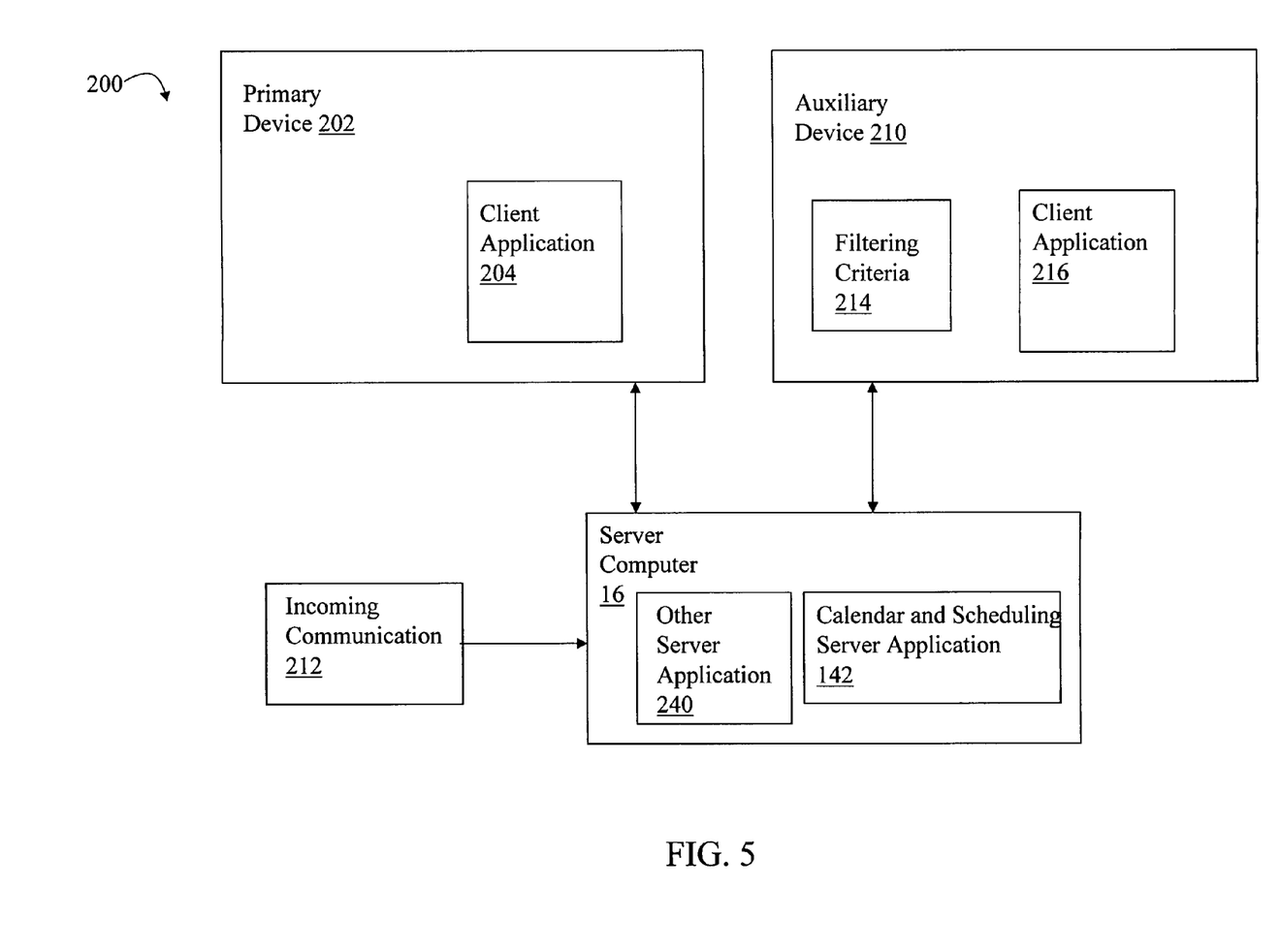
FIG. 5 is an example illustrating data flow between some of the components of FIGS. 2, 3 and 4 in connection with the techniques described herein.

Referring now to FIG. 5, shown is an example 200 illustrating the data flow between components of a primary device, an auxiliary device, and the server computer in one embodiment. It should be noted that the components of FIG. 5 make reference to similarly named components described elsewhere herein such as in connection with FIGS. 2, 3 and 4. It should be noted that the devices 202 and 206 represent any device that has connectivity to the server computer 16 and functioning, respectively, as the primary device and the auxiliary device.

In the example 200, an incoming communication 212 may be received by the server 16. The incoming communication 212 may be an email directed to an email server application (e.g., other server application 240). Subsequently, the server 16 may forward the incoming communication to the primary device 202 of a registered user. For example, an incoming transmission which is an email may be forwarded to an email client application denoted as element 204 of the user's computer functioning as the primary device in connection with the techniques described herein. The user may have previously performed processing to specify filtering criteria 214 for the email client application on the auxiliary device 210. An instance of the email client application may be executing on the primary device as 204 and another instance of the email client application may be executing on the auxiliary device as 216.

It should be noted that an embodiment may have a client application on a device, such as an email client application as described herein, perform processing enabling the device to function as an auxiliary device. In such cases, the primary device and the auxiliary device may each have a same instance of the client application with the appropriate processing performed in accordance with whether the device functions as an auxiliary device. Alternatively, an embodiment may incorporate the functionality performed by the client application on an auxiliary device in a separate component and include the component on the auxiliary device but not on another device which will not function as an auxiliary device.

The email client application of the auxiliary device may issue a request to the email server application on the server computer 16. As described herein, the query may be performed in accordance with the filtering criteria 214 specified on the auxiliary device for the particular email client application. The email server application may provide a response including the requested information. The email client application 216 of the auxiliary device may perform processing to display notifications regarding the communications in a display area of the device 210.

Figure 6:
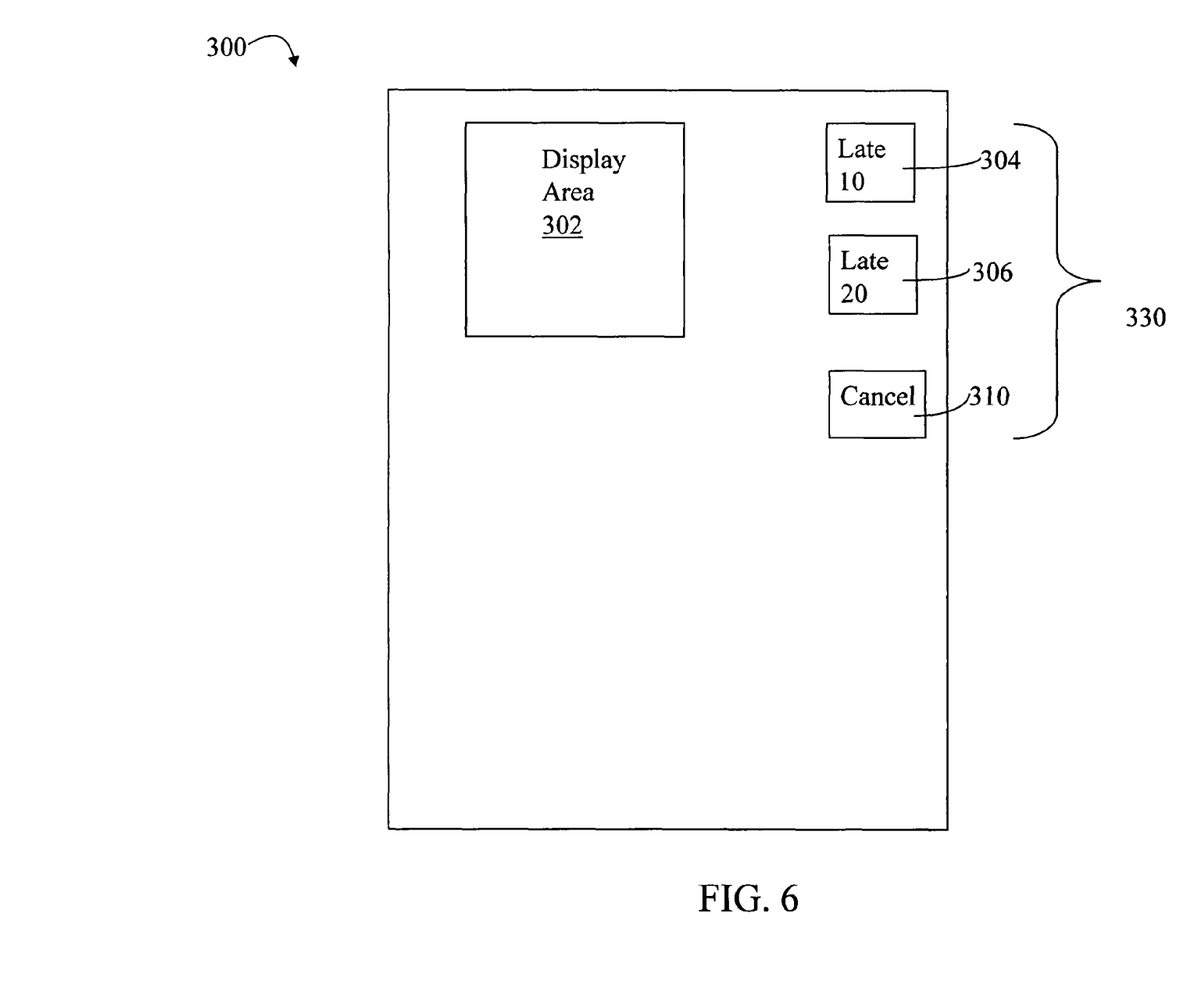
FIG. 6 is an example of components of an auxiliary device as may be used in connection with displaying notifications and configured soft keys.

Referring now to FIG. 6, shown is an example of soft buttons and a display area as may be included on an auxiliary device and used in connection with the techniques described herein. The example 300 includes a display area 302, a set of soft buttons or keys 330. It should be noted that an embodiment may include a portion of the buttons or keys of 330 rather than all as illustrated in the example 300. The display area 302 may vary with the particular device. For example, the auxiliary device may be a mobile communications device or a phone having a single display. As such, the display area 302 may be the single display area of the device. The device may also include more than one display area. For example, the device may be a telephone that includes a primary display area and an auxiliary display area. The auxiliary display area may be used to display any notifications as generated in connection with the techniques described herein.

One or more of the soft buttons in sets 330 may be configured as active at a point in time in accordance with the current notification context of the auxiliary device. The current notification context may include the currently selected or displayed notification as well as the current time.

In the example 300, the set of buttons 330 may be configured as active in connection with a notification for a meeting or scheduled appointment. The soft buttons included in the example 300 may correspond to deterministic or preprogrammed one-button responses as described in more detail in following paragraphs.

In response to selecting one of the actively displayed soft buttons in 330, processing steps associated with an operation represented by the selected soft button are performed. What will now be described are the different operations which may correspond to the various soft buttons included in 330 in one embodiment.

Soft buttons 304 and 306 may correspond to notification operations which inform meeting participants that another participant making the soft button selection is going to be late for a scheduled meeting. The operations of buttons 304, 306 and others may be applied in the context of a meeting associated with a current notification for an appointment entry as may be displayed in display area 302. In this example, selection of button 304 results in a notification message that the user making the selection is running 10 minutes late. Selection of button 306 results in a notification message that the user making the selection is running 20 minutes late. An embodiment may configure soft buttons to other amounts of time than as described herein. An embodiment may also include a button which may be characterized as a generic late soft button not having a predetermined amount of time associated therewith. Such a soft button may be displayed as "Late". Buttons 304 and 306 may be displayed or otherwise configured as active, for example, when the currently selected or displayed notification relates to a scheduled appointment reminder. The auxiliary device may display a notification regarding the meeting reminder in area 302 and configure buttons 304, 306 and 310 as active. Configuration of such soft buttons may be performed by module 42. In response to selecting 304 or 306, the module 42 may communicates with a client application on the auxiliary device regarding the selection and the amount of time the user making the selection is running late. The client application may then communicate with the appropriate corresponding server application on server 16.

Soft button 310 corresponds to a notification operation which informs meeting participants that another participant making the soft button selection is canceling the meeting and will not be participating. In one embodiment, the cancel operation may result in a notification message sent to all attendees in a manner as described in connection with buttons 304 and 306. The notification may indicate that the user selecting button 310 is unable to participate and other attendees may elect to continue with the meeting. Soft button 310 may be operable and performed with respect to a current notification displayed in area 302.

It should be noted that one or more of the soft buttons in area 330 may also be actively/inactively configured in accordance with a current time. For example, if the scheduled meeting time has passed, the soft buttons 304, 306 and 310 may be inactivated.

Other embodiments may include other soft buttons or keys in accordance with the particular application and services.

Figure 7:
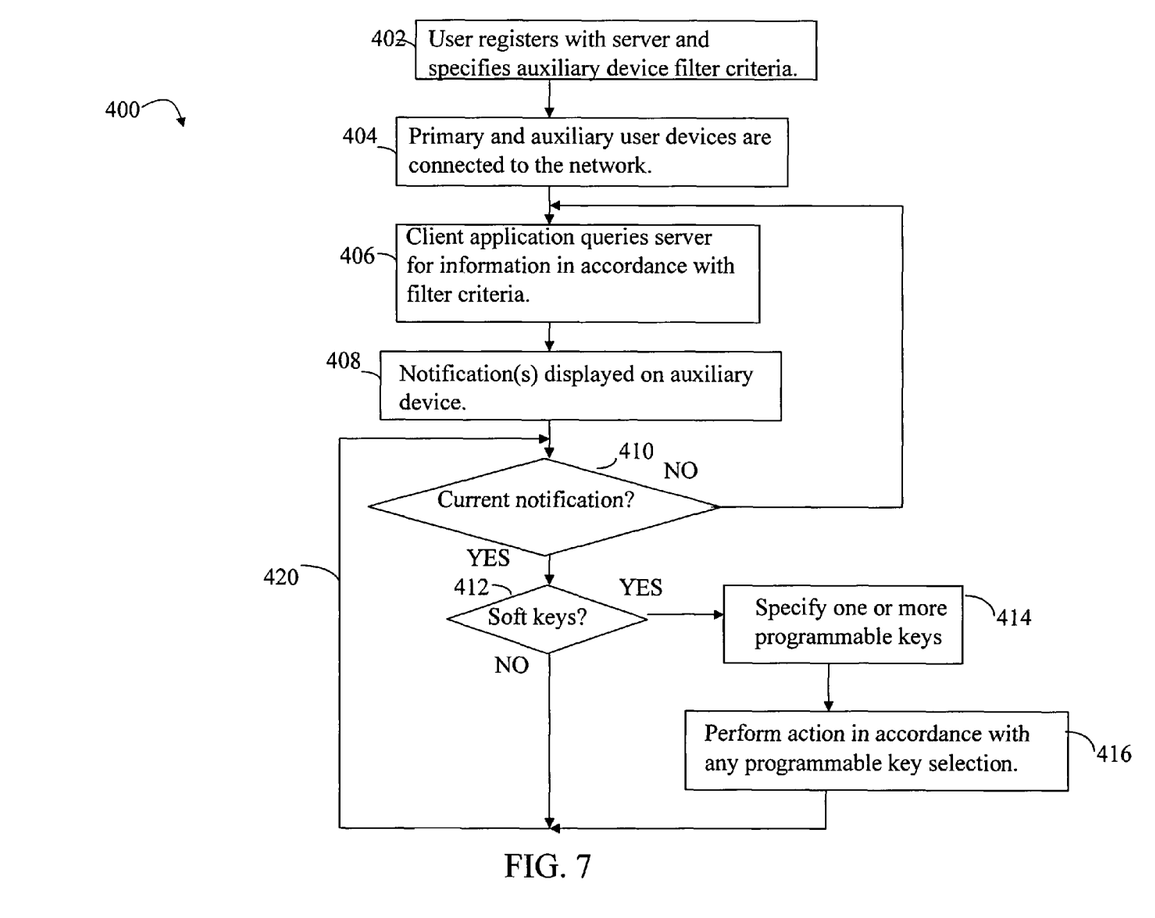
FIG. 7 is a flowchart of processing steps that may be performed in an embodiment in connection with the techniques described herein.

Referring now to FIG. 7, shown is a flowchart 400 summarizing the processing steps just described in connection with the techniques herein. At step 402, a user registers with the server 16 which may be a communications server as described herein. The user also specifies auxiliary device filter criteria. As described herein, the filter criteria may be specified for each service performed by a client application on each auxiliary device. At step 404, the primary and auxiliary devices connect to the network. It should be noted that to utilize the techniques described herein, the primary device does not need to be actively connected to the network. At step 406, a client application of the auxiliary device queries the server for information in accordance with the filter criteria specified at step 402. At step 408, one or more notifications may be displayed on the auxiliary device in accordance with the information provided by the server in step 406. The processing performed in loop 420 may be performed for each notification on the auxiliary device. The processing of loop 420 may be performed, for example, for a current notification of the auxiliary device. The current notification may be, for example, the currently selected or displayed notification of the current notification context. Loop 420 may be repeatedly performed, for example, as a user traverses a list of one or more notifications displayed on the display area of the auxiliary device. In connection with an embodiment using the techniques described herein, when there is no longer a current notification, then all notifications have been deleted by the user. At step 410, a determination is made as to whether there is a current notification. If not, processing proceeds to step 406. If step 410 evaluates to yes, control proceeds to step 412 where a determination is made as to whether any soft keys are to be configured as active in accordance with the current notification. If not, control proceeds to step 410. Otherwise, if step 412 evaluates to yes, control proceeds to step 414 where one or more programmable keys are specified. At step 416, an action is performed in accordance with any programmable key selection. Step 416 may be performed on condition that a user selects one of the programmable keys. Subsequently, control proceeds to step 410.

Although the foregoing examples utilize a model in which selective information regarding incoming communications are pulled from the server by the auxiliary device, it will be appreciated by those skilled in the art that other models may be used in connection with the techniques described herein. For example, an embodiment may utilize the techniques described herein with an auxiliary output device in which the selective information used to generate notifications is displayed on the auxiliary output device.

It should be noted that an embodiment may utilize any one or more different security measures in connection with the techniques described herein. For example, different techniques may be performed in connection with an auxiliary output device querying the server 16 in connection with the techniques described herein. In one embodiment, the particular auxiliary output devices which are allowed to perform such queries for a registered user may have been previously specified to the server 16.

In connection with the techniques described herein, the display area of the auxiliary device may be used to provide selective information at a glance. The auxiliary device may be used to filter received communications from one or more applications in connection with one or more different services to assist a user in identifying communications in accordance with specified filter criteria such as, for example, in identifying important and urgent communications, personal or non-business communications, or business related communications. The auxiliary device may be used to supplement a primary device, such as a computer, which may not always be on or enabled to display received communications.

The notification on the auxiliary device as illustrated herein may be displayed on a display area of the auxiliary device. It should be noted that an embodiment may also have the auxiliary device provide audible tones and/or voice messages when notifications are displayed or otherwise selected as a current notification.

As another example of the use of the auxiliary device, a building security or other department may send out a network-wide notification regarding a hazardous weather condition, security condition or event, and the like. If a user, for example, is away from his/her computer, the user may receive such urgent notifications on an auxiliary device, such as a mobile communications device. The user may also receive such notifications as well as upcoming meeting notifications on the auxiliary communications device without logging on to the user's computer, which may be the primary device.

The techniques described herein may also be used with filtering voice or phone messages that may be received, for example, in an IP telephony system. In such a system, A may call B. B's phone may record the event that a "telephone message from A" was received. The telephone message from A may also cause the system to send an email to B's computer, B's primary device, that a telephone message from A has been received. User B may have an auxiliary device specified which then displays a notification regarding the email to B's computer. B may have specified filtering criteria for the auxiliary device to provide notifications regarding emails forwarded to B's computer (e.g., the primary device) concerning phone messages and missed calls from A.

The techniques described herein may also be used with providing filtered notifications in connection with instant messages. For example, A may attempt to send an instant message to B at B's computer (e.g., a primary device). B's computer may not be on or otherwise connected to the network. B may have specified filtering criteria for an auxiliary device such that when A tries to send an instant message to B on B's computer, a notification is subsequently provided on the auxiliary device regarding A's instant message.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method of providing notification regarding communications comprising:
   registering a primary device with a server, wherein said primary device is a computer;
   registering an auxiliary device with said server;
   providing filter criteria for said auxiliary device;
   receiving by said server an incoming communication for a user of said primary device;
   determining by said server whether information regarding said incoming communication is sent to said auxiliary device in accordance with said filter criteria independent of a state of said primary device;
   providing by said server said information regarding said incoming communication to said auxiliary device if said filter criteria is met; and
   programming a plurality of soft keys based on said information received by said auxiliary device, each soft key corresponding to a different operation which can be taken by the user in response to the incoming communication.

2. The method of claim 1, wherein a client application on said auxiliary device requests information regarding incoming communications from a server in accordance with said filter criteria.

3. The method of claim 2, wherein said client application performs e-mail services.

4. The method of claim 2, wherein said client application performs calendar and meeting scheduling services.

5. The method of claim 1, wherein said filter criteria is specified for one or more client applications on said auxiliary device for each service performed by one of said client applications.

6. The method of claim 5, wherein one of said client applications performs e-mail services and calendar and meeting scheduling services, and wherein filter criteria includes first filter information for said e-mail services and second filter information for said calendar and meeting scheduling services.

7. The method of claim 1, wherein said primary device and said auxiliary device are connected in a same network.

8. The method of claim 1, wherein said primary device is offline with respect to a network to which said auxiliary device is connected.

9. The method of claim 1, wherein said auxiliary device is a phone.

10. The method of claim 1, wherein said auxiliary device is a mobile communications device.

11. The method of claim 1, wherein said auxiliary device receives said information causing a notification in the form of a message to be displayed on a display area of said auxiliary device.

12. The method of claim 1, wherein said auxiliary device receives said information causing a notification in the form of an audio output by said auxiliary device.

13. The method of claim 3, wherein said filter criteria for said client application includes one or more of: an email address of a sender of an email, a priority associated with an email communication, a defined group of one or more users, and a domain name.

14. The method of claim 4, wherein said filter criteria for said client application includes one or more of: a communication regarding a newly scheduled meeting request, a meeting request from a designated user, a scheduled appointment reminder, date information, and time information.

15. A method of providing notification regarding communications comprising:
registering a user with a server;
assigning the user a user identifier;
registering a computer with the server using the user identifier;
receiving by the server an incoming communication for the user;
providing an auxiliary device for said computer;
registering the auxiliary device with the server using the user identifier;
providing filter criteria for said auxiliary device;
querying said server, by said auxiliary device, whether incoming communications in accordance with said filter criteria have been sent to said computer;
providing by said server information regarding said incoming communications to said auxiliary device in accordance with said filter criteria in response to said querying; and
programming a plurality of soft keys of said auxiliary device based on a context of said information received by said auxiliary device, each soft key corresponding to a deterministic or preprogrammed one-button response to the incoming communication.

16. A method of providing notification regarding communications comprising:
registering a primary device with a server, wherein said primary device is a computer;
registering a first auxiliary device with said server;
providing filter criteria for said first auxiliary device;
registering a second auxiliary device with said server, wherein the second auxiliary device is a different device than the first auxiliary device;
providing filter criteria for said second auxiliary device, wherein the filter criteria for said second auxiliary device is different than said filter criteria for said first auxiliary device;
receiving by said server an incoming communication for a user of said primary device;
determining by said server whether information regarding said incoming communication is sent to said first auxiliary device in accordance with said filter criteria for said first auxiliary device;
providing by said server said information regarding said incoming communication to said first auxiliary device only if said filter criteria for said first auxiliary device is met;
determining by said server whether information regarding said incoming communication is sent to said second auxiliary device in accordance with said filter criteria for said second auxiliary device;
providing by said server said information regarding said incoming communication to said second auxiliary device only if said filter criteria for said second auxiliary device is met; and
programming a plurality of soft keys of said second auxiliary device based on said information received by said second auxiliary device, each soft key corresponding to a different operation which can be taken by the user in response to the incoming communication, wherein programming of the plurality of soft keys changes with time.

* * * * *